US012648359B2

(12) United States Patent
Takagishi

(10) Patent No.: US 12,648,359 B2
(45) Date of Patent: Jun. 2, 2026

(54) AUDIO SPEAKER SYSTEM USING PIEZO DIAPHRAGM

(71) Applicant: Diodes Incorporated, Plano, TX (US)

(72) Inventor: Hideto Takagishi, Plano, TX (US)

(73) Assignee: Diodes Incorporated, Plano, TX (US)

( * ) Notice: Subject to any disclaimer, the term of this patent is extended or adjusted under 35 U.S.C. 154(b) by 827 days.

(21) Appl. No.: 18/146,718

(22) Filed: Dec. 27, 2022

(65) Prior Publication Data

US 2024/0215451 A1 Jun. 27, 2024

(51) Int. Cl.
| | |
|---|---|
| *H01L 41/02* | (2006.01) |
| *H04R 7/06* | (2006.01) |
| *H04R 17/02* | (2006.01) |
| *H10N 30/00* | (2023.01) |
| *H10N 30/30* | (2023.01) |

(52) U.S. Cl.
CPC ............. *H10N 30/308* (2023.02); *H04R 7/06* (2013.01); *H04R 17/02* (2013.01); *H10N 30/704* (2024.05); *H04R 2400/01* (2013.01)

(58) Field of Classification Search
CPC ... H10N 30/308; H10N 30/302; H10N 30/704
USPC .................................................. 310/322, 334
See application file for complete search history.

(56) References Cited

U.S. PATENT DOCUMENTS

| | | | | |
|---|---|---|---|---|
| 4,451,710 A | * | 5/1984 | Taylor | ................... H04R 3/002 |
| | | | | 310/317 |
| 2018/0242087 A1 | | 8/2018 | Miyoshi | |

FOREIGN PATENT DOCUMENTS

JP 2000115869 A 4/2000

OTHER PUBLICATIONS

International Search Report and Written Opinion for Application No. PCT/US2023/034211, mailed on Feb. 1, 2024, 9 pages.

* cited by examiner

*Primary Examiner* — Derek J Rosenau
(74) *Attorney, Agent, or Firm* — AP3 Law Firm PLLC

(57) ABSTRACT

An audio speaker system includes: an amplifier, where a positive input terminal of the amplifier is configured to be coupled to a first reference voltage node; and a piezo diaphragm including: a metal plate; a first piezo film attached to the metal plate, where the first piezo film is configured to function as a speaker during operation of the audio speaker system; and a second piezo film attached to the metal plate and spaced apart from the first piezo film, where the second piezo film is configured to function as a microphone during operation of the audio speaker system, where an output terminal of the amplifier is coupled to the first piezo film, and where a negative input terminal of the amplifier is coupled to the second piezo film.

20 Claims, 10 Drawing Sheets

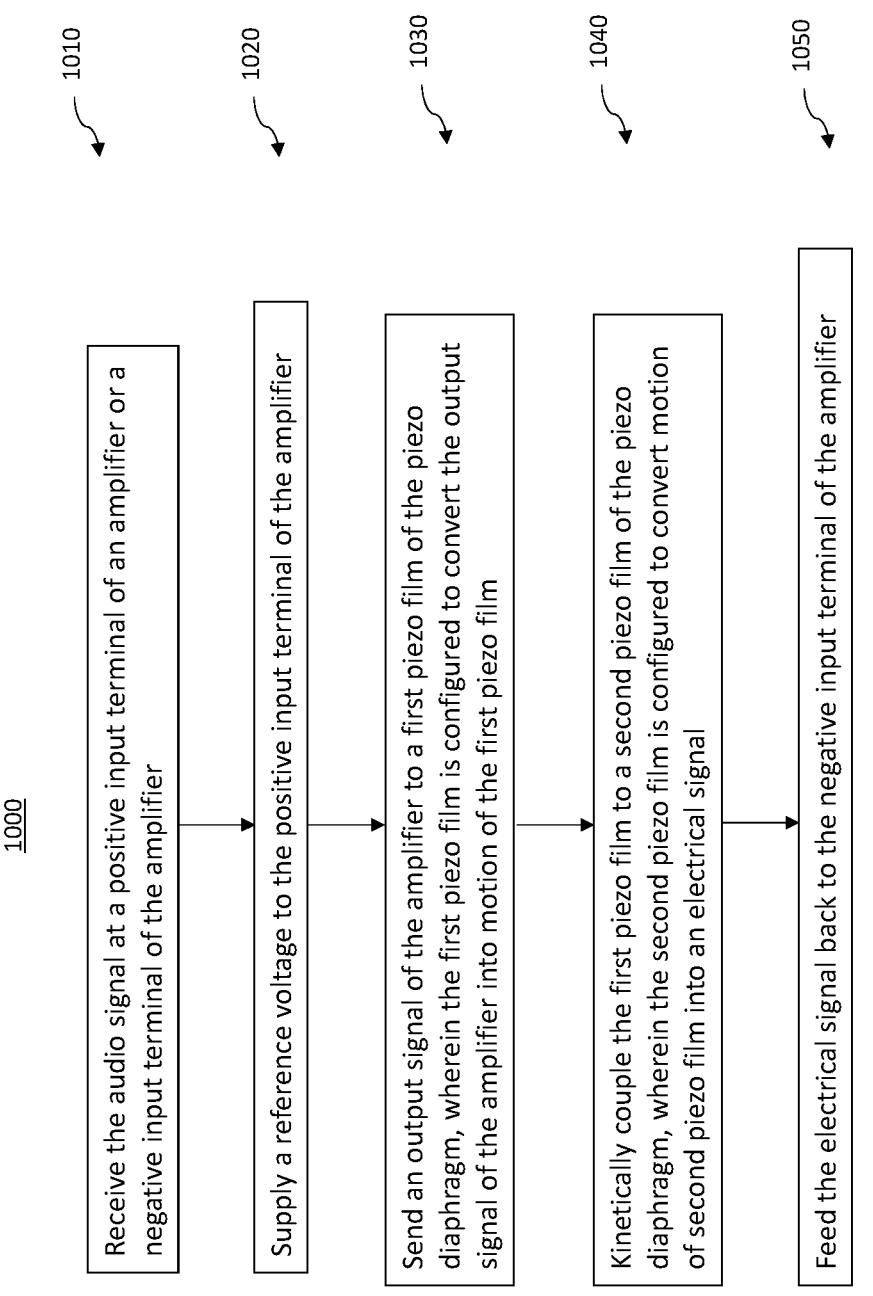

1000

1010 — Receive the audio signal at a positive input terminal of an amplifier or a negative input terminal of the amplifier 1020 — Supply a reference voltage to the positive input terminal of the amplifier 1030 — Send an output signal of the amplifier to a first piezo film of the piezo diaphragm, wherein the first piezo film is configured to convert the output signal of the amplifier into motion of the first piezo film 1040 — Kinetically couple the first piezo film to a second piezo film of the piezo diaphragm, wherein the second piezo film is configured to convert motion of second piezo film into an electrical signal 1050 — Feed the electrical signal back to the negative input terminal of the amplifier

Fig. 11

AUDIO SPEAKER SYSTEM USING PIEZO DIAPHRAGM

TECHNICAL FIELD

The present invention relates generally to audio speaker systems, and in particular, audio speaker systems built using piezo diaphragms.

BACKGROUND

Piezo speakers are widely used as speakers in, e.g., mobile devices or computers, due to their small form factors. Piezo speakers are typically very thin (e.g., 1 mm or less in thickness) and are designed to have a nearly flat frequency response within the audio frequency band, such as between 1 KHz and 20 KHz, and for some special piezo speakers, between 500 Hz and 20 KHz. To achieve the nearly flat frequency response, piezo speakers may be designed to have a multi-layered structure and/or using special material(s). As a result, piezo speakers are relatively expensive (e.g., between 1 and 10 dollars each currently).

Piezo diaphragms (also referred to as piezo buzzers) are widely available on the market and generally cost a fraction (e.g., ⅓ or less) of the price of piezo speakers. Piezo diaphragms have been designed for applications where audio quality is not a concern. For example, piezo diaphragms are typically used in alarms, buzzers, or the like, where sound comprising mostly of a tone (e.g., a single frequency) is produced by the piezo diaphragm. When used in a typical circuit configuration (e.g., for use as an alarm, or a buzzer), the piezo diaphragm has a non-flat frequency response in the audio frequency band, with many peaks and valleys in the frequency response curve. For example, the maximum variation in the frequency response of the piezo diaphragm within the audio frequency band may be as large as, e.g., 30 dB or more. Such a poor frequency response may cause serious distortion of audio signal, and is the reason that piezo diaphragms are currently not able to be used as speakers for audio signals, such as music, human voice, or the like.

The current disclosure discloses various embodiments where piezo diaphragms are used to form audio speaker systems suitable for playing audio signals. Significant cost reduction can be achieved by using piezo diaphragms instead of piezo speakers in the audio speaker systems while maintaining the small form factors.

SUMMARY

In accordance with an embodiment, an audio speaker system includes: an amplifier, wherein a positive input terminal of the amplifier is configured to be coupled to a first reference voltage node; and a piezo diaphragm comprising: a metal plate; a first piezo film attached to the metal plate, wherein the first piezo film is configured to function as a speaker during operation of the audio speaker system; and a second piezo film attached to the metal plate and spaced apart from the first piezo film, wherein the second piezo film is configured to function as a microphone during operation of the audio speaker system, wherein an output terminal of the amplifier is coupled to the first piezo film, and wherein a negative input terminal of the amplifier is coupled to the second piezo film.

In accordance with an embodiment, an audio speaker system includes: a piezo diaphragm comprising: a metal plate; a first piezo film attached to the metal plate; and a second piezo film attached to the metal plate, wherein the second piezo film is at least partially surrounded by the first piezo film and is spaced apart from the first piezo film; and an amplifier, wherein an output terminal of the amplifier is coupled to the first piezo film, wherein a negative input terminal of the amplifier is coupled to the second piezo film, and wherein a positive input terminal of the amplifier is configured to be coupled to a first reference voltage node.

In accordance with an embodiment, a method of playing an audio signal using a piezo diaphragm includes: receiving the audio signal at a positive input terminal of an amplifier or a negative input terminal of the amplifier; supplying a reference voltage to the positive input terminal of the amplifier; sending an output signal of the amplifier to a first piezo film of the piezo diaphragm, wherein the first piezo film is configured to convert the output signal of the amplifier into motion of the first piezo film; kinetically coupling the first piezo film to a second piezo film of the piezo diaphragm, wherein the second piezo film is configured to convert motion of second piezo film into an electrical signal; and feeding the electrical signal back to the negative input terminal of the amplifier.

BRIEF DESCRIPTION OF THE DRAWINGS

For a more complete understanding of the present invention, and the advantages thereof, reference is now made to the following descriptions taken in conjunction with the accompanying drawings, in which:

FIG. 11 illustrates a flow chart of a method of playing an audio signal using a piezo diaphragm, in some embodiments.

DETAILED DESCRIPTION OF ILLUSTRATIVE EXAMPLES

Figure 1:
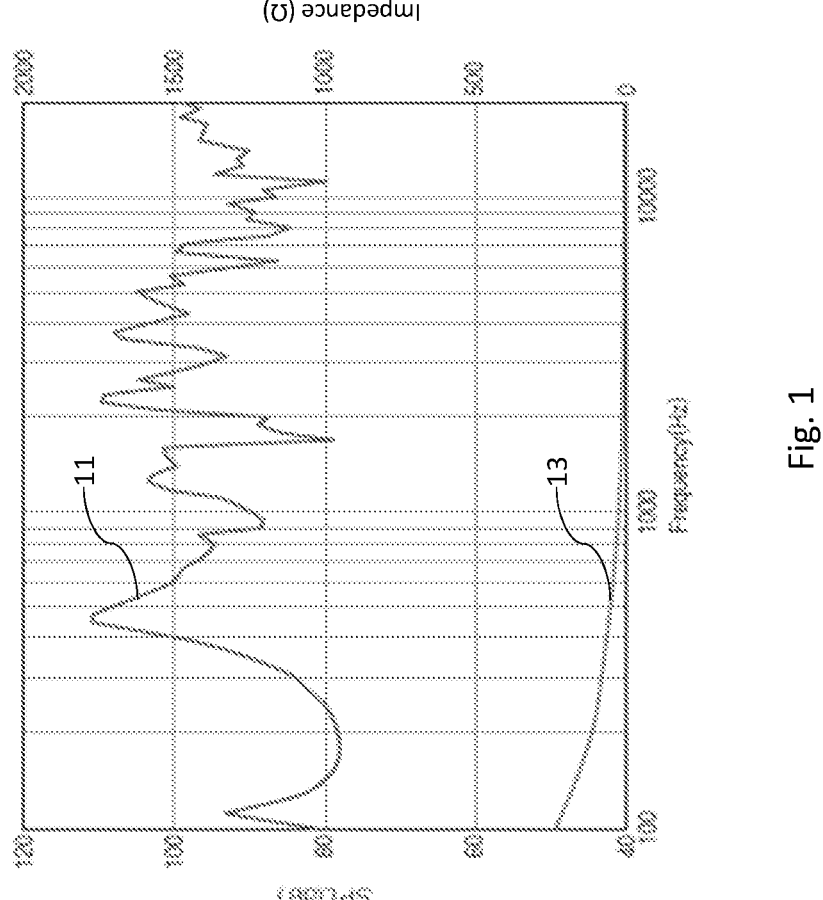
FIG. 1 illustrates the frequency response of a piezo diaphragm in a conventional application of piezo diaphragm, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals or labels in different figures refer to the same or similar component or signal.

The present disclosure will be described with respect to examples in a specific context, namely audio speaker systems built using piezo diaphragms.

FIG. 1 illustrates the frequency response of a piezo diaphragm in a conventional application of piezo diaphragm, in an embodiment. In such applications, the piezo diagram is used to generate a sound (e.g., a tone) for, e.g., an alarm, a buzzer, or the like.

In FIG. 1, the curve 11 illustrates the sound pressure level (SPL) of the piezo diaphragm, and the curve 13 illustrates the impedance of the piezo diaphragm. As illustrated in FIG. 1, the amplitude of the frequency response (e.g., curve 11) varies significantly within the audio frequency band. Multiple peaks and valleys are observed in the frequency response of FIG. 1. The maximum variation in the frequency response may be as large as, e.g., 30 dB or more. Such a poor frequency response may cause serious distortions to audio signals (e.g., music, human voice, or the like) comprising multiple, and/or continuous frequency components over the audio frequency band. Therefore, conventional speak systems built using the piezo diaphragm are not suitable for playing audio signals.

Figure 2B:
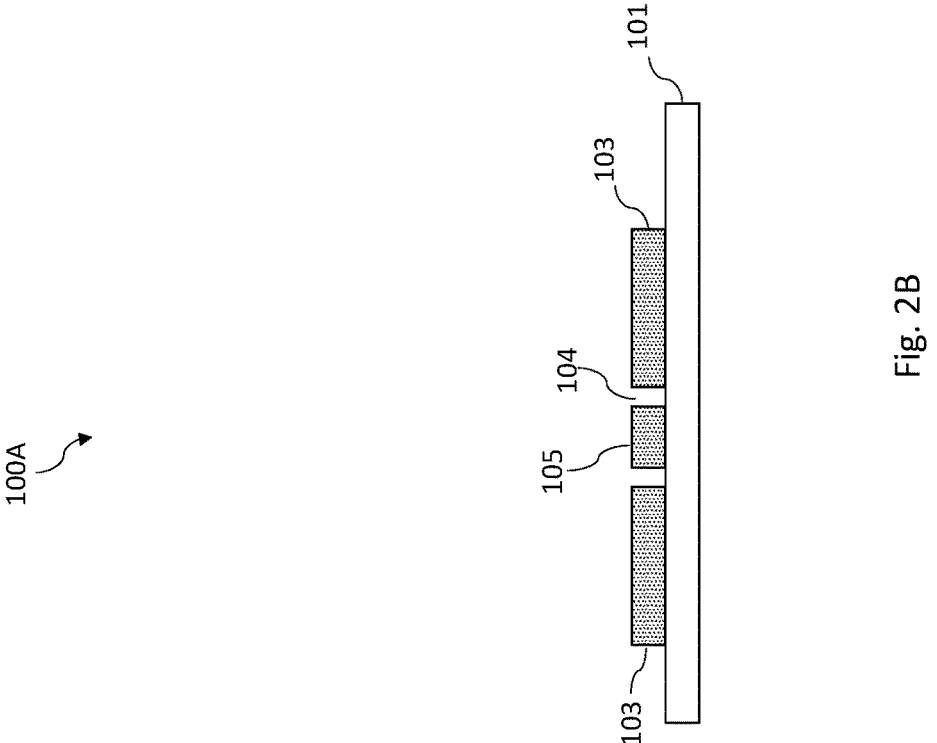
FIGS. 2A and 2B illustrate various views of a piezo diaphragm, in an embodiment.
Figure 2A:
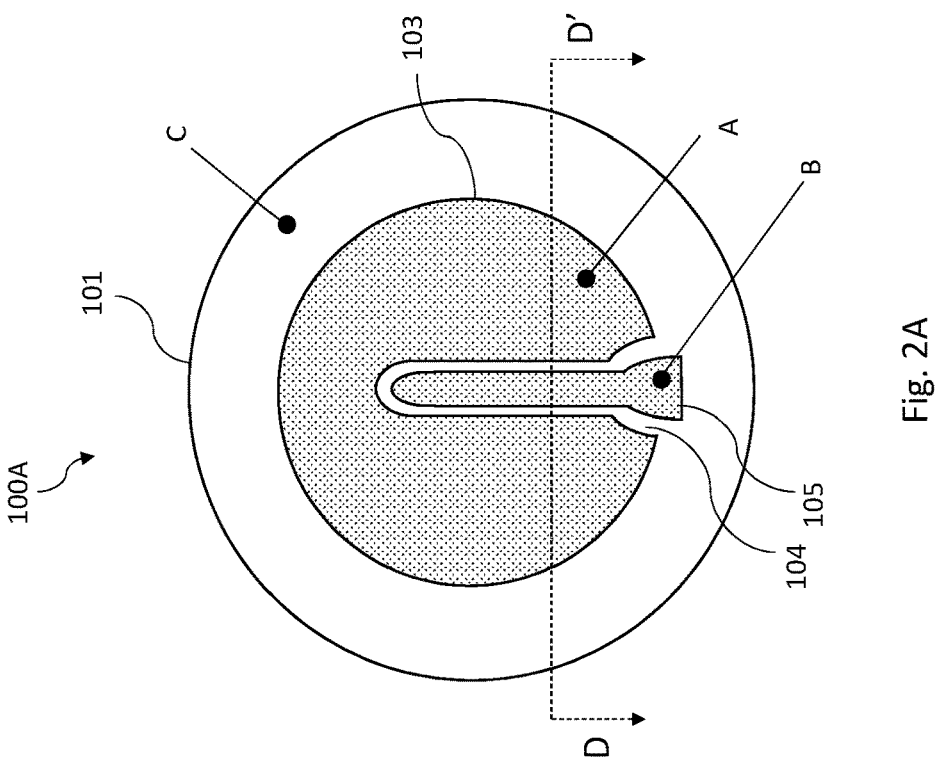

FIGS. 2A and 2B illustrate a top view and a cross-sectional view of a piezo diaphragm 100A, respectively, in an embodiment. FIG. 2B illustrates the cross-sectional view of the piezo diaphragm 100A along across-section D-D' in FIG. 2A.

As illustrated in FIGS. 2A and 2B, the piezo diaphragm 100A includes a plate 101, a first piezo film 103, and a second piezo film 105. In some embodiments, the plate 101 is a metal plate, such as a brass plate, a nickel-alloy plate, or the like. The first piezo film 103 and the second piezo film 105 are formed of a same piezoelectric material, in an embodiment. In another embodiment, the first piezo film 103 and the second piezo film 105 are formed of different piezoelectric materials.

The first piezo film 103 and the second piezo film 105 may be formed by depositing a layer of a piezoelectric material on the plate 101, then patterning (e.g., etching using an etching mask having a mask pattern) the deposited piezoelectric material to remove portions of the deposited piezoelectric material. After the patterning, the remaining portions of the deposited piezoelectric material form the first piezo film 103 and the second piezo film 105. In other embodiments, each of the first piezo film 103 and the second piezo film 105 may be pre-formed as a layer of dielectric material having a pre-determined shape, then the pre-formed first piezo film 103 and the pre-formed second piezo film are attached (e.g., glued) to the plate 101.

In the example of FIG. 2A, the plate 101 has a circular shape. The first piezo film 103 has a circular shape with a slit. The inner portion of the slit has a test tube shape, and the outer portion of the slit is enlarged and has a curved shape. In the illustrated example, the second piezo film 105 is disposed within the slit of the first piezo film 103, and may have a geometric similar shape as the slit. For example, the second piezo film 105 may have a test tube shape at one end, and has an enlarged portion at another end. As illustrated in FIG. 2A, the second piezo film 105 is at least partially surrounded by the first piezo film 103. Note that the second piezo film 105 is spaced apart from the first piezo film 103, and there is a gap 104 (e.g., empty space) between the second piezo film 105 and the first piezo film 103. The shapes and the relative positions of the first piezo film 103 and the second piezo film 105 allow good coupling (e.g., kinetic coupling) between the first piezo film 103 and the second piezo film 105. For example, vibration of the first piezo film 103 causes the same or similar vibration of the second piezo film 105.

FIG. 2A further illustrates three terminals of the piezo diaphragm 100A: a terminal A attached to the first piezo film 103, a terminal B attached to the second piezo film 105, and a third terminal C attached to the plate 101. Each of the terminals A, B, and C may be formed by bonding (e.g., soldering) a conductive wiring component (e.g., a copper wire, a metal connector, or the like) to the respective component (e.g., 103, 105, or 101) of the piezo diaphragm 100A, in some embodiments.

In the illustrated embodiments, during operation of the piezo diaphragm 100A (e.g., as the speaker in an audio speaker system), the terminal C is coupled to a reference voltage such as electrical ground. The terminal A is configured to receive an (amplified) audio signal (e.g., a time-varying electrical voltage carrying audio information). The first piezo film 103 is configured to convert the audio signal (e.g., an electrical signal) into motion (e.g., vibration) of the first piezo film 103 to produce an audio sound. In other words, the first piezo film 103 is configured to function as a speaker. The motion (e.g., vibration) of the first piezo film 103 is picked up (e.g., sensed) by the second piezo film 105 through the kinetic coupling between the first piezo film 103 and the second piezo film 105, and results in motion (e.g., vibration) of the second piezo film 105. The second piezo film 105 generates an electric signal in response to its motion. In other words, the second piezo film 105 functions as a microphone, which converts the audio sound produced by the first piezo film 103 into an electrical signal, which electric signal is fed back to a negative input terminal of an amplifier of the audio speaker system. The amplifier produces the amplified audio signal sent to the first piezo film 103. Details are discussed hereinafter.

Figure 3:
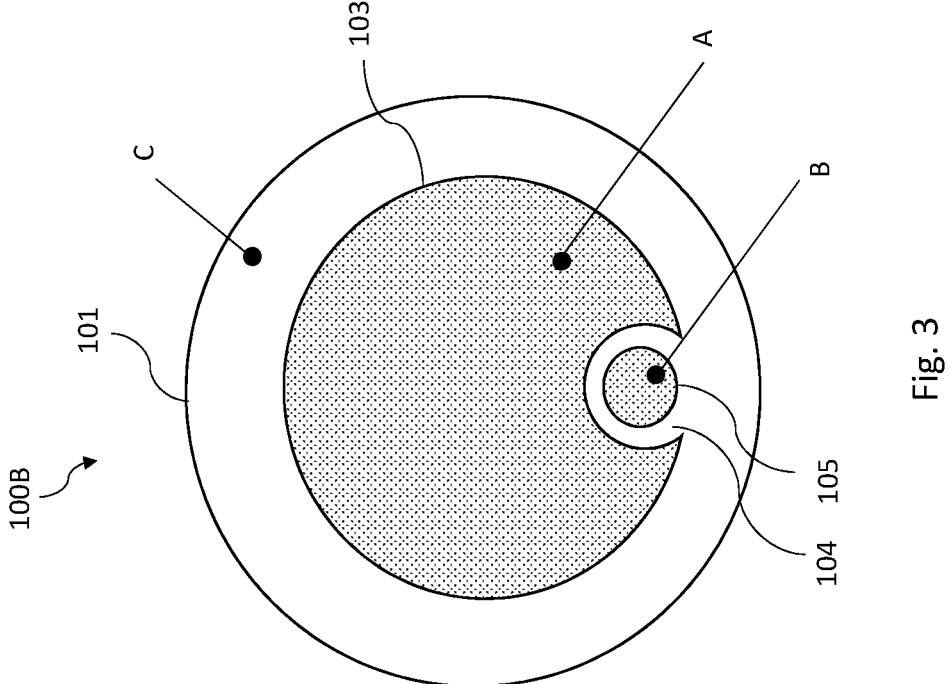
FIGS. 3-5 illustrate various embodiments of a piezo diaphragm.
Figure 5:
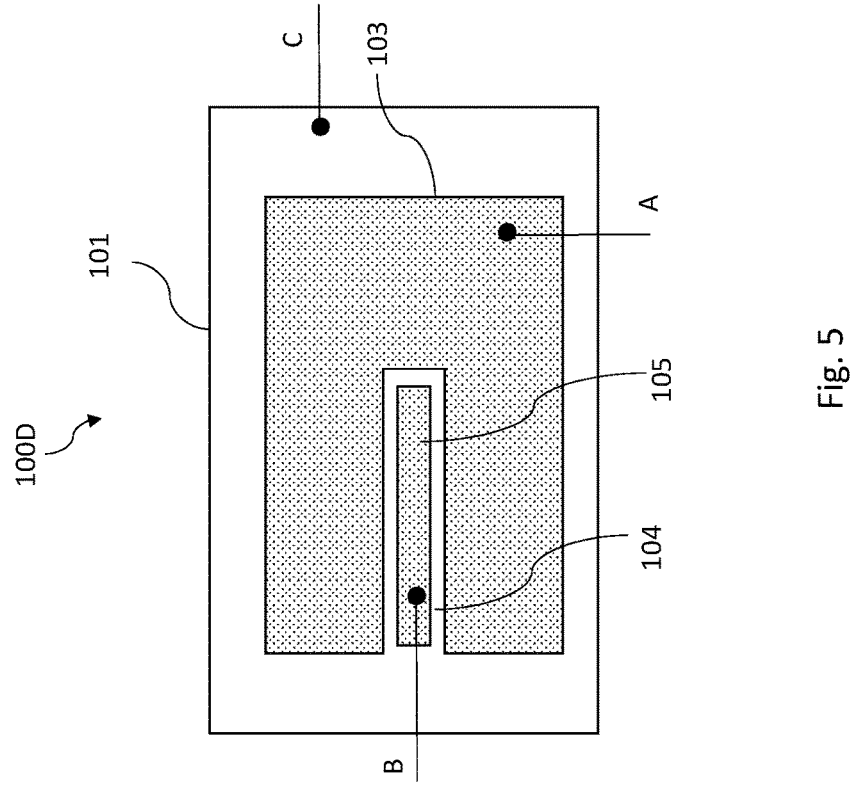
Figure 4:
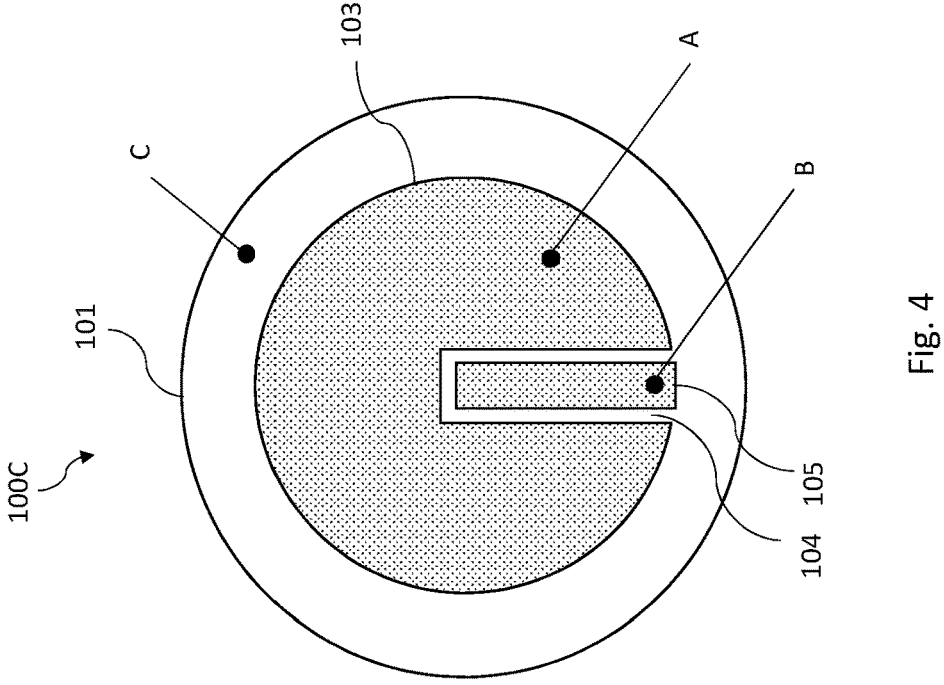

FIGS. 3-5 illustrate various embodiments of a piezo diaphragm. In particular, FIGS. 3, 4, and 5 illustrate the top views of a piezo diaphragm 100B, a piezo diaphragm 100C, and a piezo diaphragm 100D, respectively. The structures and the functions of the piezo diaphragms 100B, 100C, and 100D are similar to those of the piezo diaphragm 100A, but with different shapes for the first piezo film 103, the second piezo film 105, and/or the plate 101.

The piezo diaphragm 100B is FIG. 3 is similar to the piezo diaphragm 100A, but the first piezo film 103 in FIG. 3 has a circular shape with a circular portion removed to form a recessed area. The second piezo film 105 of the piezo diaphragm 100B has a (smaller) circular shape and is disposed within the recessed area.

The piezo diaphragm 100C is FIG. 4 is similar to the piezo diaphragm 100A, but the slit in the first piezo film 103 of FIG. 4 has a rectangular shape, and the second piezo film 105 of the piezo diaphragm 100C also has a rectangular shape and is disposed within the rectangular shaped slit of the first piezo film 103 of FIG. 4.

The piezo diaphragm 100D is FIG. 5 is similar to the piezo diaphragm 100C, with rectangular shaped slit in the first piezo film 103 and rectangular shaped second piezo film 105. However, the plate 101 in FIG. 5 has a rectangular shape, and the first piezo film 103 also has a rectangular shape.

The various embodiments of the piezo diaphragms illustrated in FIGS. 2A, 2B, and 3-5 are illustrative and non-limiting. Other shapes and/or structures for the piezo diaphragms are also possible and are fully intended to be included within the scope of the present disclosure. Note that the piezo diaphragms (e.g., 100A, 100B, 100C, and 100D)

described herein belong to the self-drive type piezo diaphragms, which has three terminals (e.g., A, B, and C), and when used as a buzzer, can be used to form an oscillation circuit to generate a frequency signal (e.g., a tone) internally. The self-drive type piezo diaphragms are different from the external-drive type piezo diaphragms, which have two terminals and need to be supplied with an external frequency signal (e.g., a tone) to generate the sound (e.g., alarm, or buzzer). The piezo diaphragms used for building audio speaker systems discussion herein are the self-drive type piezo diaphragms.

Figure 6:
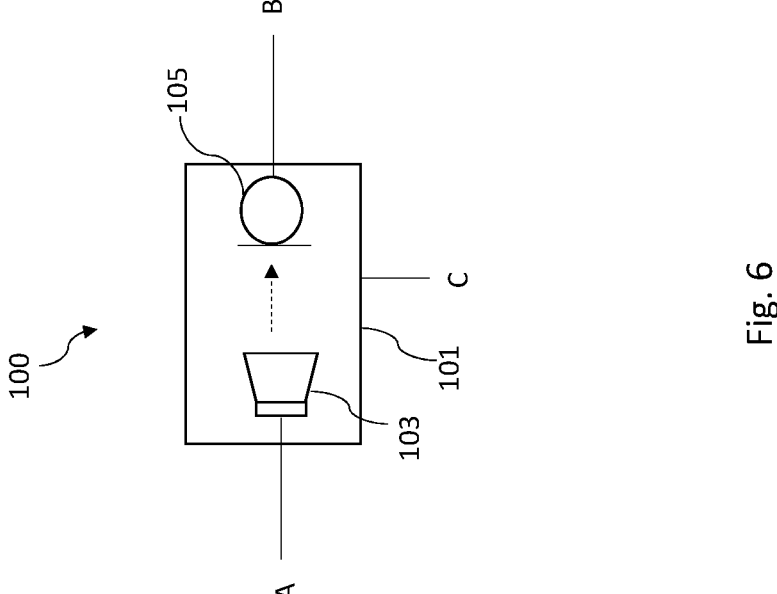
FIG. 6 illustrates a symbol for the piezo diaphragm, in an embodiment.

FIG. 6 illustrates a symbol for a piezo diaphragm 100, in an embodiment. The piezo diaphragm 100 may represent any suitable self-drive type piezo diaphragms, such as the piezo diaphragms 100A, 100B, 100C, and 100D. The symbol illustrated in FIG. 6 is used in subsequent figures to represent the piezo diaphragm used in an audio speaker system. As illustrated in FIG. 6, the symbol shows the plate 101, the first piezo film 103 (shown as a speaker icon), and the second piezo film 105 (shown as a microphone icon). The dashed arrow in FIG. 6 illustrates the coupling (e.g., kinetic coupling) between the first piezo film 103 and the second piezo film 105. The symbol in FIG. 6 further illustrates the terminals A, B, and C of the piezo diaphragm 100.

Figure 7:
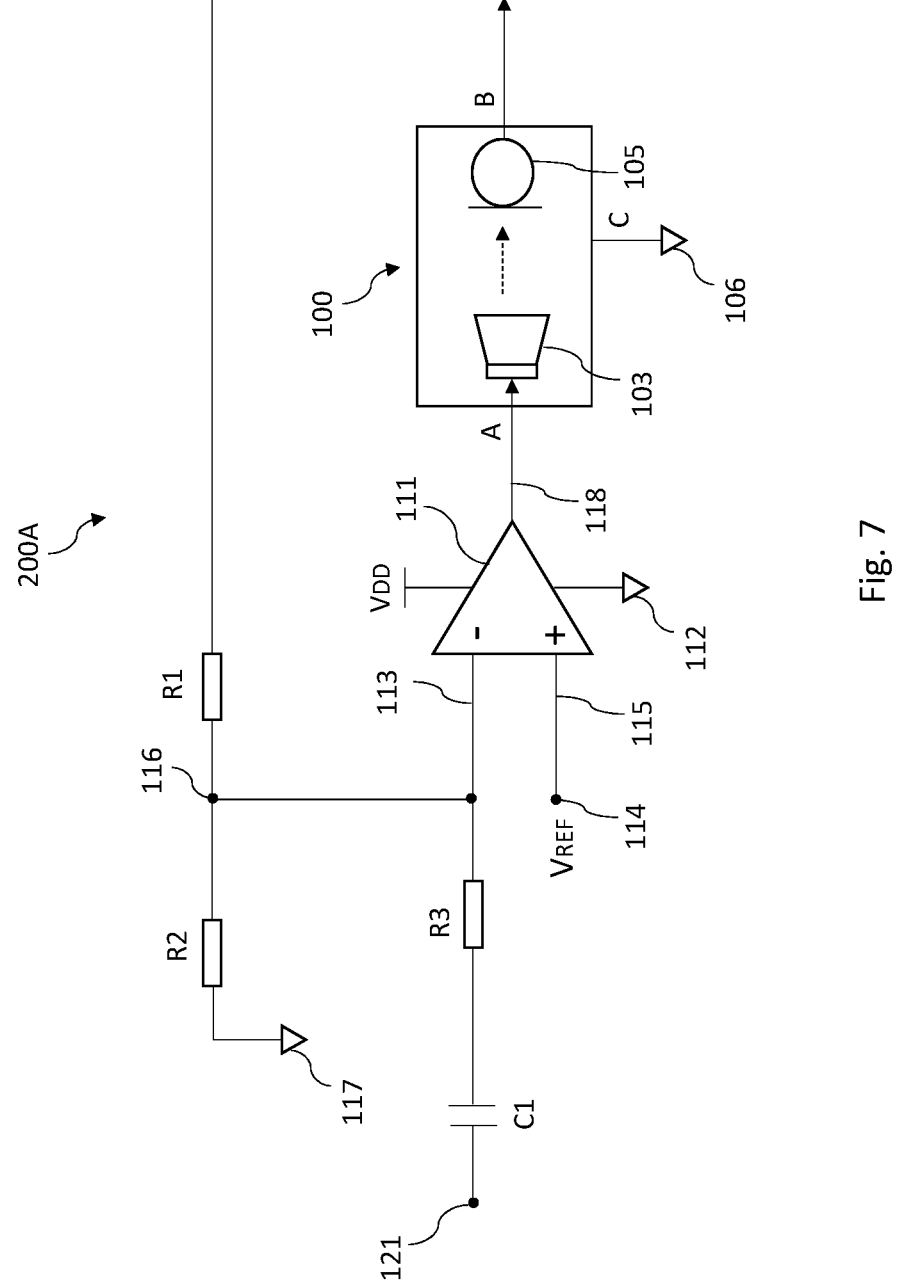
FIG. 7 illustrates an audio speaker system built using a piezo diaphragm, in an embodiment.

FIG. 7 illustrates an audio speaker system 200A, in an embodiment. The audio speaker system 200A is suitable for playing audio signals such as music and voice, and is formed using a piezo diaphragm 100. The piezo diaphragm 100 may be any suitable piezo diaphragm, such as piezo diaphragm 100A, 100B, 100C, 100D, or a commercially available (e.g., off-the shelf) self-drive type piezo diaphragm. For simplicity, FIG. 7 may not illustrate all features of the audio speaker system 200A.

As illustrated in FIG. 7, the audio speaker system 200A includes a piezo diaphragm 100 and an amplifier 111. The amplifier 111 may be, e.g. an audio amplifier such as an operational amplifier. In the example of FIG. 7, the amplifier 111 is coupled between a power supply having a supply voltage $V_{DD}$ (e.g., +3V, +5V, or the like) and a reference voltage node 112 that is coupled to, e.g., electrical ground. An output terminal 118 of the amplifier 111 is coupled to the terminal A of the piezo diaphragm 100, and provides an amplified audio signal to the first piezo film 103 (which functions as the speaker). The terminal B of the piezo diaphragm 100 outputs an electrical signal (e.g., a voltage signal) generated by the second piezo film 105. The terminal C of the piezo diaphragm 100 is coupled to a reference voltage node 106 coupled to, e.g., electrical ground.

Still referring to FIG. 7, a reference voltage $V_{REF}$ is applied to a node 114, which is coupled to a positive input terminal 115 of the amplifier 111. The reference voltage $V_{REF}$ has a fixed nominal value and may be, e.g., half of the supply voltage $V_{DD}$, as an example.

An audio signal (e.g., a time-varying voltage signal carrying audio information) is applied to a node 121, which is coupled to a negative input terminal 113 of the amplifier 111 via a capacitor $C_1$ and a resistor $R_3$ coupled in series. In some embodiments, the capacitor $C_1$ functions as a high-pass filter to block (e.g., filter out) low frequency components (e.g., DC component) of the audio signal.

As illustrated in FIG. 7, a resistor $R_1$ and a resistor $R_2$ are coupled in series between the terminal B of the piezo diaphragm 100 and a reference voltage node 117. The reference voltage node 117 is coupled to electrical ground, in the illustrated embodiment. A node 116 between the resistors $R_1$ and $R_2$ is also coupled to the negative input terminal 113 of the amplifier 111.

During operation of the audio speaker system 200A, the audio signal applied at the node 121 is filtered by the capacitor $C_1$ (e.g., to remove low frequency components such as DC component). The filtered audio signal is sent to the amplifier 111 and is amplified by the amplifier 111. The amplified audio signal at the output terminal 118 of the amplifier 111 drives (e.g., excites) the first piezo film 103 and causes motion (e.g., vibration) of the first piezo film 103 to generate an audio sound (e.g., music, or voice). The motion (e.g., vibration) of the first piezo film 103, through kinetically coupling, results in a same or similar motion (e.g., vibration) of the second piezo film 105, which functions as a microphone and converts the audio sound into an electrical signal (e.g., a voltage signal). The electrical signal is fed back to the negative input terminal 113 of the amplifier 111. In the example of FIG. 7, a scaled version of the electrical signal at the terminal B is generated by a voltage divider formed by the resistors $R_1$ and $R_2$, and is combined (e.g., added together) with the filtered audio signal to form a feedback voltage, which feedback voltage is then applied to the negative input terminal 113 of the amplifier 111.

Figure 8:
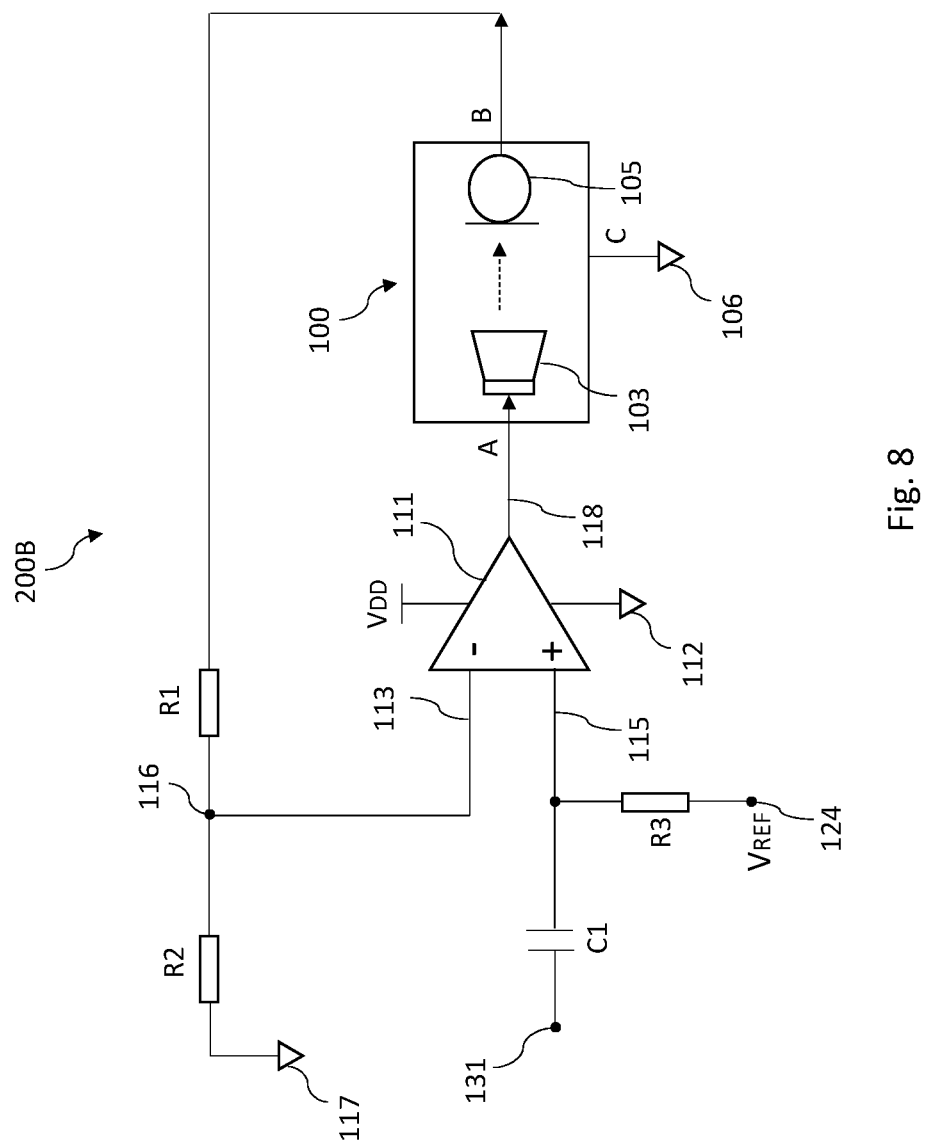
FIG. 8 illustrates an audio speaker system built using a piezo diaphragm, in another embodiment.

FIG. 8 illustrates an audio speaker system 200B, in another embodiment. The audio speaker system 200B is similar to the audio speaker system 200A, but the audio signal is applied to a node 131, which node 131 is coupled to the positive input terminal 115 of the amplifier 111 through the capacitor $C_1$. In addition, the reference voltage $V_{REF}$ is applied to a node 124, which node 124 is coupled to the positive input terminal 115 of the amplifier 111 through the resistor $R_3$. Operation of the audio speaker system 200B is similar to that of the audio speaker system 200A, thus details are not discussed here. Note that in both audio speaker systems 200A and 200B, the electrical signal at the terminal B is fed back to the negative input terminal 113 of the amplifier.

Figure 9:
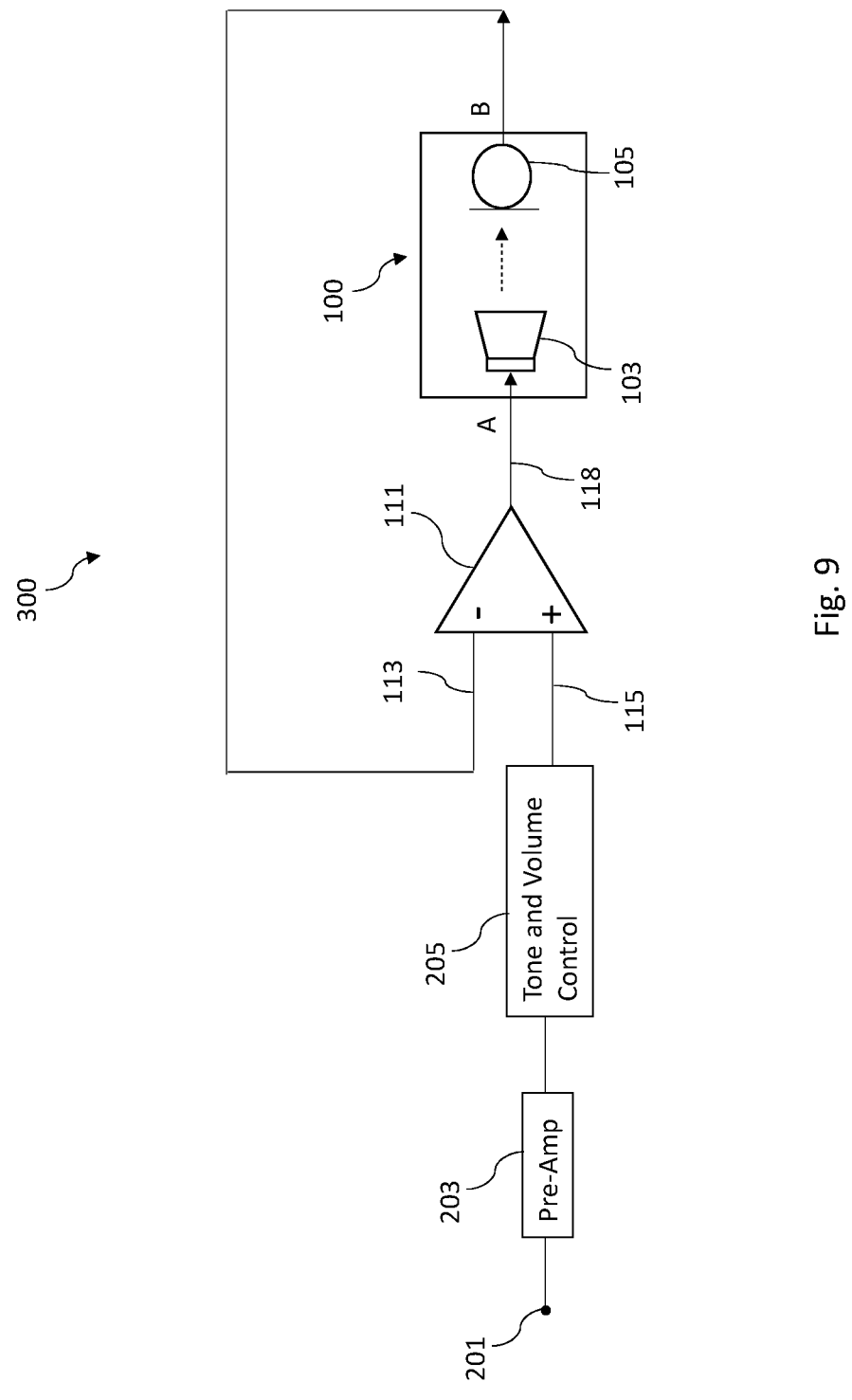
FIG. 9 illustrates an audio speaker system built using a piezo diaphragm, in yet another embodiment.

FIG. 9 illustrates an audio speaker system 300, in yet another embodiment. The audio speaker system 300 is similar to the audio speaker system 200B (or 200A), but with less details to show the speaker system at a higher level of abstraction. For example, FIG. 9 shows that the electrical signal at the terminal B of the piezo diaphragm 100 is fed back to the negative input terminal 113 of the amplifier, which is one of the many features that differ from the conventional circuit configuration that uses the piezo diaphragm 100 in applications such as alarm or buzzer. The amplifier 111 and the piezo diaphragm 100 in FIG. 9 represent a high level abstraction of the audio speaker systems 200A and 200B.

In addition, in FIG. 9, the audio signal is applied at a node 201. The audio signal is then processed (e.g., amplified) by a pre-amplifier 203 (e.g., an audio pre-amplifier). The output of the pre-amplifier 203 is then processed by a tone and volume control circuit 205, which may be, e.g., a filter than adjusts the gain and/or the phase of the audio signal at different frequencies of the audio frequency band. In some embodiments, one, or both, of the pre-amplifier 203 and the tone and volume control circuit 205 are omitted. In some embodiments, the audio signal at the output of the tone and volume control circuit 205 is applied to the node 121 in FIG. 7 or the node 131 in FIG. 8.

Modifications and variations of the present disclosure are possible and are fully intended to be included within the scope of the present disclosure. For example, the examples in FIGS. 7, 8, and 9 use single-ended signals as non-limiting examples. One skilled in the art will readily appreciate that the principle of the present disclosure applies to differential signals, and the disclosed embodiments can be readily adapted for differential signals. In addition, the disclosed embodiments can be used with different types of amplifiers, such as Class A, Class AB, Class D, Class G, and Class H amplifiers.

Figure 10:
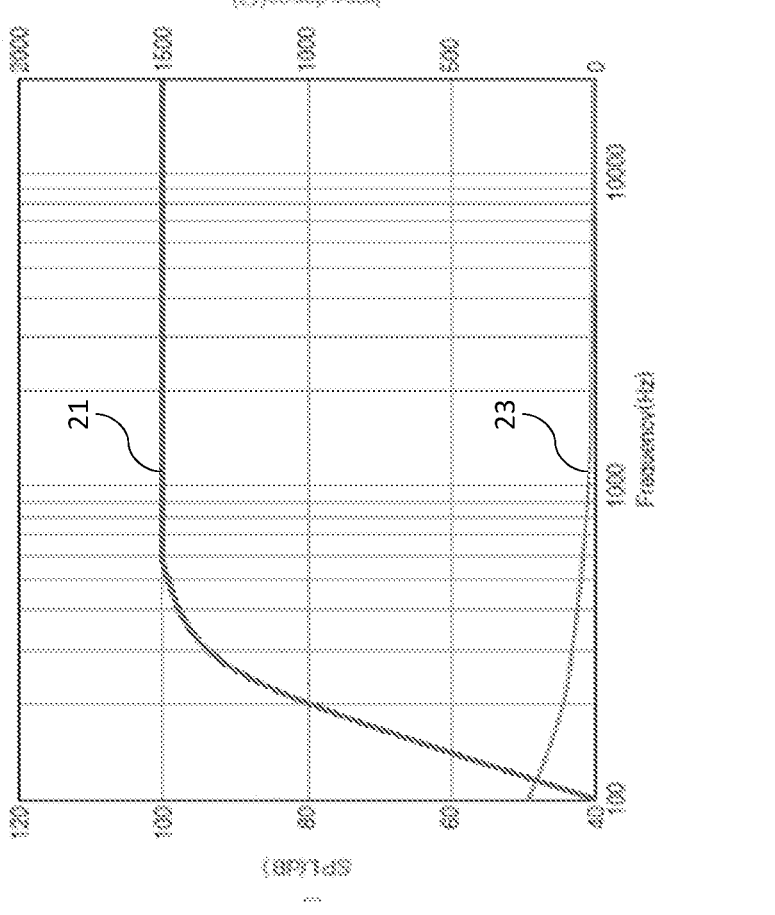
FIG. 10 illustrates the frequency response of a piezo diaphragm used in an audio speaker system, in an embodiment.

FIG. 10 illustrates the frequency response of a piezo diaphragm used in an audio speaker system, in an embodiment. The audio speaker system may be, e.g., the audio speaker system 200A, 200B, or 300.

In FIG. 10, the curve 21 illustrates the sound pressure level (SPL) of the piezo diaphragm, and the curve 23 illustrates the impedance of the piezo diaphragm. As illustrated in FIG. 10, the amplitude of the frequency response (e.g., curve 21) stays substantially flat within the audio frequency band (e.g., between 1 KHz and 20 KHz). In some embodiments, within the audio frequency band, the maximum variation in the frequency response from the mean value of the frequency response is smaller than 3 dB. For example, the amplitude of the frequency response may be within ±3 dB of a mean value of the amplitude of the frequency response in the audio frequency band. Such a substantially flat frequency response allows high-quality audio signals (e.g., music, human voice, or the like) to be generated using the piezo diaphragm.

FIG. 11 illustrates a flow chart of a method of playing an audio signal using a piezo diaphragm, in some embodiments. It should be understood that the example method shown in FIG. 11 is merely an example of many possible example methods. One of ordinary skill in the art would recognize many variations, alternatives, and modifications. For example, various steps as illustrated in FIG. 11 may be added, removed, replaced, rearranged, or repeated.

Referring to FIG. 11 at block 1010, the audio signal is received at a positive input terminal of an amplifier or a negative input terminal of the amplifier. At block 1020, a reference voltage is supplied to the positive input terminal of the amplifier. At block 1030, an output signal of the amplifier is sent to a first piezo film of the piezo diaphragm, wherein the first piezo film is configured to convert the output signal of the amplifier into motion of the first piezo film. At block 1040, the first piezo film is kinetically coupled to a second piezo film of the piezo diaphragm, wherein the second piezo film is configured to convert motion of second piezo film into an electrical signal. At block 1050, the electrical signal is fed back to the negative input terminal of the amplifier.

Embodiments may achieve advantages as described below. For example, the audio speaker systems disclosed herein are formed using piezo diaphragms. The disclosed circuit configurations of the audio speaker systems allow the audio speaker systems to achieve excellent frequency response previously un-achievable using piezo diaphragms. Since piezo diaphragms are much cheaper than piezo speakers while having about the same form factors (e.g., sizes), the disclosed audio speaker systems (which uses piezo diaphragms) can be used to replace the currently used, much more expensive, speaker systems formed using piezo speakers.

Examples of the present invention are summarized here. Other examples can also be understood from the entirety of the specification and the claims filed herein.

Example 1. In accordance with an embodiment, an audio speaker system includes: an amplifier, wherein a positive input terminal of the amplifier is configured to be coupled to a first reference voltage node; and a piezo diaphragm comprising: a metal plate; a first piezo film attached to the metal plate, wherein the first piezo film is configured to function as a speaker during operation of the audio speaker system; and a second piezo film attached to the metal plate and spaced apart from the first piezo film, wherein the second piezo film is configured to function as a microphone during operation of the audio speaker system, wherein an output terminal of the amplifier is coupled to the first piezo film, and wherein a negative input terminal of the amplifier is coupled to the second piezo film.

Example 2. The audio speaker system of Example 1, wherein during operation of the audio speaker system, the microphone formed by the second piezo film is kinetically coupled to the speaker formed by the first piezo film.

Example 3. The audio speaker system of Example 1, further comprising a first resistor and a second resistor coupled in series between the second piezo film and a second reference voltage node, wherein the negative input terminal of the amplifier is coupled to a first node between the first resistor and the second resistor.

Example 4. The audio speaker system of Example 3, further comprising: a capacitor and a third resistor coupled in series between the negative input terminal of the amplifier and a second node, wherein the second node is configured to receive an audio signal.

Example 5. The audio speaker system of Example 4, wherein the second reference voltage node is configured to be coupled to electrical ground, wherein the first reference voltage node is configured to be coupled to voltage supply having a voltage higher than electrical ground.

Example 6. The audio speaker system of Example 3, further comprising: a capacitor coupled between a second node and the positive input terminal of the amplifier, wherein the second node is configured to receive an audio signal; and a third resistor coupled between the positive input terminal of the amplifier and the first reference voltage node.

Example 7. The audio speaker system of Example 6, wherein during operation of the audio speaker system, a voltage at the second reference voltage node is equal to electrical ground, and a voltage at the first reference voltage node is higher than electrical ground.

Example 8. The audio speaker system of Example 1, wherein the audio speaker system has a frequency response within a frequency band between 1 KHz and 20 KHz, wherein an amplitude variation of the frequency response within the frequency band is smaller than 3 dB.

Example 9. The audio speaker system of Example 1, further comprising an audio pre-amplifier coupled between an input terminal of the audio speaker system and the positive input terminal of the amplifier.

Example 10. The audio speaker system of Example 9, further comprising a tone and volume control circuit coupled between the audio pre-amplifier and the positive input terminal of the amplifier.

Example 11. In accordance with an embodiment, an audio speaker system includes: a piezo diaphragm comprising: a metal plate; a first piezo film attached to the metal plate; and a second piezo film attached to the metal plate, wherein the second piezo film is at least partially surrounded by the first piezo film and is spaced apart from the first piezo film; and an amplifier, wherein an output terminal of the amplifier is coupled to the first piezo film, wherein a negative input terminal of the amplifier is coupled to the second piezo film, and wherein a positive input terminal of the amplifier is configured to be coupled to a first reference voltage node.

Example 12. The audio speaker system of Example 11, wherein during operation of the audio speaker system, the first piezo film is configured to convert a first electric signal at the output terminal of the amplifier into motion of the first piezo film, the second piezo film is configured to be kinetically coupled to the first piezo film and configured to convert motion of the second piezo film into a second electric signal.

Example 13. The audio speaker system of Example 12, wherein the second piezo film is coupled to a voltage divider comprising a first resistor and a second resistor coupled in series, wherein a first node between the first resistor and the second resistor is coupled to the negative input terminal of the amplifier.

Example 14. The audio speaker system of Example 13, further comprising a capacitor and a third resistor coupled in series between the first node and a second node, wherein the second node is configured to receive an audio signal.

Example 15. The audio speaker system of Example 13, further comprising: a third resistor coupled between the positive input terminal of the amplifier and the first reference voltage node; and a capacitor coupled between the positive input terminal of the amplifier and a second node, wherein the second node is configured to receive an audio signal.

Example 16. The audio speaker system of Example 11, wherein the piezo diaphragm has a frequency response in a frequency band between 1 KHz and 20 KHz during operation of the audio speaker system, wherein a maximum variation in an amplitude of the frequency response is less than 3 dB in the frequency band.

Example 17. In accordance with an embodiment, a method of playing an audio signal using a piezo diaphragm includes: receiving the audio signal at a positive input terminal of an amplifier or a negative input terminal of the amplifier; supplying a reference voltage to the positive input terminal of the amplifier; sending an output signal of the amplifier to a first piezo film of the piezo diaphragm, wherein the first piezo film is configured to convert the output signal of the amplifier into motion of the first piezo film; kinetically coupling the first piezo film to a second piezo film of the piezo diaphragm, wherein the second piezo film is configured to convert motion of second piezo film into an electrical signal; and feeding the electrical signal back to the negative input terminal of the amplifier.

Example 18. The method of Example 17, wherein feeding the electrical signal back comprises: generating a scaled version of the electrical signal using a voltage divider; and sending the scaled version of the electrical signal to the negative input terminal of the amplifier.

Example 19. The method of Example 17, wherein receiving the audio signal comprises receiving the audio signal at a first node, wherein a capacitor and a resistor are coupled in series between the first node and the negative input terminal of the amplifier.

Example 20. The method of Example 17, wherein receiving the audio signal comprises receiving the audio signal at a first node, wherein a capacitor is coupled between the first node and the positive input terminal of the amplifier, wherein supplying the reference voltage comprises supplying the reference voltage to a second node, wherein a resistor is coupled between the second node and the positive input terminal of the amplifier.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. An audio speaker system comprising:
an amplifier, wherein a positive input terminal of the amplifier is configured to be coupled to a first reference voltage node; and
a piezo diaphragm comprising:
a metal plate;
a first piezo film attached to the metal plate, wherein the first piezo film is configured to function as a speaker during operation of the audio speaker system; and
a second piezo film attached to the metal plate and spaced apart from the first piezo film, wherein the second piezo film is configured to function as a microphone during operation of the audio speaker system, wherein an output terminal of the amplifier is coupled to the first piezo film, and wherein the second piezo film is coupled to an input node of a voltage divider, and an output node of the voltage divider is coupled to a negative input terminal of the amplifier.

2. The audio speaker system of claim 1, wherein during operation of the audio speaker system, the microphone formed by the second piezo film is kinetically coupled to the speaker formed by the first piezo film.

3. The audio speaker system of claim 1, wherein the voltage divider comprises a first resistor and a second resistor coupled in series between the second piezo film and a second reference voltage node, wherein the negative input terminal of the amplifier is coupled to a first node between the first resistor and the second resistor, the first node being the output node of the voltage divider.

4. The audio speaker system of claim 3, further comprising:
a capacitor and a third resistor coupled in series between the negative input terminal of the amplifier and a second node, wherein the second node is configured to receive an audio signal.

5. The audio speaker system of claim 4, wherein the second reference voltage node is configured to be coupled to electrical ground, wherein the first reference voltage node is configured to be coupled to voltage supply having a voltage higher than electrical ground.

6. The audio speaker system of claim 3, further comprising:
a capacitor coupled between a second node and the positive input terminal of the amplifier, wherein the second node is configured to receive an audio signal; and
a third resistor coupled between the positive input terminal of the amplifier and the first reference voltage node.

7. The audio speaker system of claim 6, wherein during operation of the audio speaker system, a voltage at the second reference voltage node is equal to electrical ground, and a voltage at the first reference voltage node is higher than electrical ground.

8. The audio speaker system of claim 1, wherein the audio speaker system has a frequency response within a frequency band between 1 KHz and 20 KHz, wherein an amplitude variation of the frequency response within the frequency band is smaller than 3 dB.

9. The audio speaker system of claim 1, further comprising an audio pre-amplifier coupled between an input terminal of the audio speaker system and the positive input terminal of the amplifier.

10. The audio speaker system of claim 9, further comprising a tone and volume control circuit coupled between the audio pre-amplifier and the positive input terminal of the amplifier.

11. An audio speaker system comprising:
a piezo diaphragm comprising:
a metal plate;
a first piezo film attached to the metal plate; and
a second piezo film attached to the metal plate, wherein the second piezo film is at least partially surrounded by the first piezo film and is spaced apart from the first piezo film; and
an amplifier, wherein an output terminal of the amplifier is coupled to the first piezo film, wherein a negative input terminal of the amplifier is coupled to an output node of a voltage divider, and an input node of the voltage divider is coupled to the second piezo film, and wherein a positive input terminal of the amplifier is configured to be coupled to a first reference voltage node.

12. The audio speaker system of claim 11, wherein during operation of the audio speaker system, the first piezo film is configured to convert a first electric signal at the output terminal of the amplifier into motion of the first piezo film, the second piezo film is configured to be kinetically coupled to the first piezo film and configured to convert motion of the second piezo film into a second electric signal.

13. The audio speaker system of claim 12, wherein the voltage divider comprises a first resistor and a second resistor coupled in series, wherein a first node between the first resistor and the second resistor is coupled to the negative input terminal of the amplifier, the first node being the output node of the voltage divider.

14. The audio speaker system of claim 13, further comprising a capacitor and a third resistor coupled in series between the first node and a second node, wherein the second node is configured to receive an audio signal.

15. The audio speaker system of claim 13, further comprising:
a third resistor coupled between the positive input terminal of the amplifier and the first reference voltage node; and
a capacitor coupled between the positive input terminal of the amplifier and a second node, wherein the second node is configured to receive an audio signal.

16. The audio speaker system of claim 11, wherein the piezo diaphragm has a frequency response in a frequency band between 1 KHz and 20 KHz during operation of the audio speaker system, wherein a maximum variation in an amplitude of the frequency response is less than 3 dB in the frequency band.

17. A method of playing an audio signal using a piezo diaphragm, the method comprising:
receiving the audio signal at a positive input terminal of an amplifier or a negative input terminal of the amplifier;
supplying a reference voltage to the positive input terminal of the amplifier;
sending an output signal of the amplifier to a first piezo film of the piezo diaphragm, wherein the first piezo film is configured to convert the output signal of the amplifier into motion of the first piezo film;
kinetically coupling the first piezo film to a second piezo film of the piezo diaphragm, wherein the second piezo film is configured to convert motion of second piezo film into an electrical signal; and
feeding a divided signal of the electrical signal obtained through a voltage divider back to the negative input terminal of the amplifier.

18. The method of claim 17, wherein feeding the divided signal of the electrical signal back comprises:
generating a scaled version of the electrical signal using the voltage divider; and
sending the scaled version of the electrical signal to the negative input terminal of the amplifier.

19. The method of claim 17, wherein receiving the audio signal comprises receiving the audio signal at a first node, wherein a capacitor and a resistor are coupled in series between the first node and the negative input terminal of the amplifier.

20. The method of claim 17, wherein receiving the audio signal comprises receiving the audio signal at a first node, wherein a capacitor is coupled between the first node and the positive input terminal of the amplifier, wherein supplying the reference voltage comprises supplying the reference voltage to a second node, wherein a resistor is coupled between the second node and the positive input terminal of the amplifier.

* * * * *